(12) United States Patent
Le et al.

(10) Patent No.: US 7,644,745 B2
(45) Date of Patent: Jan. 12, 2010

(54) BONDING OF TARGET TILES TO BACKING PLATE WITH PATTERNED BONDING AGENT

(75) Inventors: Hien-Minh Huu Le, San Jose, CA (US); Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 643 days.

(21) Appl. No.: 11/146,763

(22) Filed: Jun. 6, 2005

(65) Prior Publication Data

US 2006/0283703 A1    Dec. 21, 2006

(51) Int. Cl.
*C23C 14/35* (2006.01)
(52) U.S. Cl. .................. 156/381; 156/276; 156/382; 156/385; 156/386; 204/298.12; 204/298.14; 204/190; 204/192.12; 204/192.1; 29/446; 29/447; 29/458; 29/442
(58) Field of Classification Search ........... 52/384–392, 52/311.1–316, 318, 474–477; 156/71, 381–382, 156/276, 583.1; 428/48–51, 594; 204/192.12, 204/298.12, 298.26, 298.13, 298.07, 209.08, 204/298.09, 298.14, 298.19, 298.2, 122.1, 204/124.5, 385–386; 427/314, 398.1; 29/458, 29/464, 446–447, 442
See application file for complete search history.

(56) References Cited

U.S. PATENT DOCUMENTS

| 3,196,818 | A | * | 7/1965 | Sune et al. ................. 72/379.2 |
| 4,011,702 | A | * | 3/1977 | Matyas ......................... 52/387 |
| 4,026,083 | A | * | 5/1977 | Hoyt et al. .................... 52/387 |
| 5,190,630 | A | * | 3/1993 | Kikuchi et al. .......... 204/192.12 |
| 5,215,639 | A | * | 6/1993 | Boys ...................... 204/192.12 |
| 5,466,355 | A | * | 11/1995 | Ohhashi et al. ......... 204/298.13 |
| 5,474,667 | A | * | 12/1995 | Hurwitt et al. .......... 204/192.12 |
| 5,565,071 | A | | 10/1996 | Demaray et al. ........ 204/192.12 |
| RE35,380 | E | * | 11/1996 | Rea et al. ....................... 52/387 |
| 5,822,937 | A | * | 10/1998 | Mahony et al. ................ 52/366 |
| 6,149,776 | A | * | 11/2000 | Tang et al. .............. 204/192.12 |
| 6,199,259 | B1 | | 3/2001 | Demaray et al. .............. 29/458 |
| 6,267,851 | B1 | * | 7/2001 | Hosokawa ............. 204/192.12 |
| 6,287,437 | B1 | * | 9/2001 | Pandhumsoporn et al. ...................... 204/298.13 |
| 2006/0006056 | A1 | * | 1/2006 | Lausberg et al. ............... 203/78 |
| 2006/0006058 | A1 | * | 1/2006 | Tepman .................. 204/192.12 |
| 2006/0266643 | A1 | * | 11/2006 | Le et al. .................. 204/298.12 |
| 2006/0283705 | A1 | * | 12/2006 | Tanase et al. ........... 204/298.12 |

FOREIGN PATENT DOCUMENTS

JP       06136533 A  *  5/1994

* cited by examiner

*Primary Examiner*—Jeanette E. Chapman
(74) *Attorney, Agent, or Firm*—Charles S. Guenzer

(57) ABSTRACT

A target assembly including a plurality of target tiles bonded to a backing plate by adhesive, for example of indium or conductive polymer, filled into recesses in the backing plate formed beneath each of the target tiles. A sole peripheral recess formed as a rectangular close band may be formed inside the tile periphery. Additional recesses may be formed inside the peripheral recess, preferably symmetrically arranged about perpendicular bisectors of rectangular tiles. The depth and width of the recesses may be varied to control the amount of stress and the stress direction.

18 Claims, 4 Drawing Sheets

BONDING OF TARGET TILES TO BACKING PLATE WITH PATTERNED BONDING AGENT

FIELD OF THE INVENTION

The invention relates generally to sputtering of materials. In particular, the invention relates to sputtering targets composed of multiple tiles.

BACKGROUND ART

Sputtering, alternatively called physical vapor deposition (PVD), is the most prevalent method of depositing layers of metals and related materials in the fabrication of semiconductor integrated circuits. Sputtering is now being applied to the fabrication of flat panel displays (FPDs) based upon thin film transistors (TFTs) in combination with liquid crystal devices (LCDs). Demaray et al. describe such a flat panel sputter reactor in U.S. Pat. No. 5,565,071, incorporated herein by reference in its entirety. However, other panel technologies are being pursued, such as plasma display, electron emission displays, and organic light emitting diodes (OLEDs). FPDs are typically fabricated on thin rectangular sheets of glass but other substrates are possible, such as polymeric sheets. A layer of silicon is deposited on the glass panel or other substrate and silicon transistors are formed in and around the silicon layer by techniques well known in the fabrication of electronic integrated circuits. The electronic circuitry formed on the glass panel is used to drive optical circuitry, such as LCDs subsequently mounted on the glass panel or plasma emitters formed in layers deposited on the glass panel.

Size constitutes one of the most apparent differences between electronic integrated circuits and flat panel display and in the equipment used to fabricate them. Demaray et al. disclose many of the distinctive features of flat panel sputtering apparatus in U.S. Pat. No. 6,199,259, incorporated herein by reference. That equipment was originally designed for panels having a size of approximately 400 mm×600 mm. Because of the increasing sizes of flat panel displays being produced and the economy of scale realized when multiple displays are fabricated on a single glass panel and thereafter diced, the size of the glass panels being processed has been continually increasing. Flat panel fabrication equipment is commercially available for sputtering onto panels having a minimum size of 1.8 m and equipment is being contemplated for panels having sizes of 2 m×2 m and even larger.

For many reasons, the target for flat panel sputtering is often formed of a sheet of the target material bonded to a target backing plate, typically formed of titanium. In the conventional method of bonding a target layer to a backing plate, a bonding layer of indium is coated on one of the two sheet-like members and the two members are pressed together at a temperature above indium's melting point of 156° C. In a more recently developed method of bonding, a conductive elastomer or other organic adhesive is applied at much lower temperature and typically cured at an elevated but relatively low temperature. Such elastomeric bonding services are available from Thermal Conductive Bonding, Inc. of San Jose, Calif. Demaray et al. in the aforecited patent disclose autoclave bonding.

It is difficult to form sputtering targets of some materials, such as refractory metals, in the large sizes commensurate with the large-size panels. Accordingly, as disclosed by Demaray et al., multiple target tiles of smaller size can be bonded to the backing plate.

It is desired to improve upon the method of bonding one or more sputtering tiles to a backing plate.

SUMMARY OF THE INVENTION

Multiple target tiles are bonded to a backing plate by adhesive filled into recesses formed in the backing plate inside of areas overlain by the bonded tiles. Preferably, the recesses do not extend to the edges of the tile areas.

The tiles may be rectangularly shaped and arranged in one- or two-dimensional arrays with gaps therebetween. However, other tile shapes are possible.

The adhesive may be a conducting organic polymeric adhesive with a relatively large thickness when filled into the recesses.

The recesses may include a peripheral recess formed as a closed band inside the periphery of the tile areas. For rectangular tiles, the peripheral recess may include four straight and connected portions. Additional recesses may be formed inside of the peripheral recesses and preferably not connected to the peripheral recesses. Preferably also, all recesses are symmetric about the perpendicular bisectors of the target areas. The additional recesses may be one or more straight recesses. They may be intersecting straight recesses, for example, formed along the perpendicular bisectors or along the diagonals of rectangular tile areas. They may be plural straight recesses arranged in parallel. They may be formed as one or more additional closed bands.

It is possible that there be no peripheral closed-band recess.

DETAILED DESCRIPTION OF THE PREFERRED EMBODIMENTS

Figure 1:
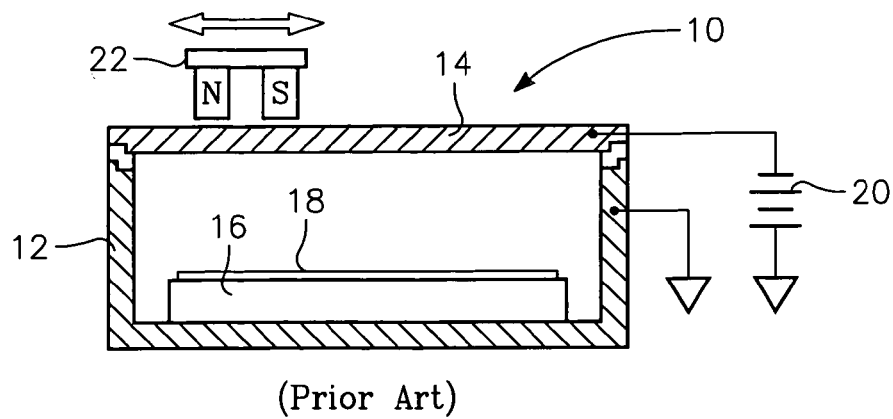
FIG. 1 is a schematic cross-sectional view of a conventional magnetron sputter reactor.

A sputtering chamber 10, schematically illustrated in the cross-sectional view of FIG. 1, includes a vacuum chamber 12, a target 14 sealed to but isolated from the electrically grounded chamber 12, and a pedestal 16 supporting a panel 18 to be sputter coated. The target 14 includes a surface layer of the material to be sputtered onto the panel 18. An argon working gas is admitted into the chamber with a pressure in the milliTorr range. A power supply 20 electrically biases the target 14 to a negative voltage of a few hundred volts, causing the argon gas to discharge into a plasma. The positive argon ions are attracted to the negatively biased target 14 and sputter target atoms from it. A magnetron 22 is scanned along the back of the target 14 to intensify the plasma and increase the sputtering rate. Some of the target atoms strike the panel 18 and form a thin film of the target atoms on its surface. The target 14 is often somewhat larger than the panel 18 being sputter coated. Sputtering has been applied to a large number of target materials including aluminum, copper, titanium, tantalum, chromium, and indium tin oxide (ITO) as well as other materials.

One problem arising from the increased panel sizes and hence increased target sizes is the difficulty of obtaining target material of proper quality in the larger sizes. Refractory materials such as chromium are particularly difficult materials. The size problem has been addressed by forming the target sputtering layer from multiple target tiles. As schematically illustrated in the plan view of FIG. 2, multiple target tiles 22 are set on a backing plate 24 with a predetermined gap 26 of size $\Delta L_1$ between them. A continuous adhesive layer 28 bonds the tiles 22 to the backing plate 24. The large peripheral area of the backing plate 24 outside the tiles 22 is used to support the target 14 on the vacuum chamber 12 and to provide plumbing ports for the water cooling channels formed in the backing plate 24.

Figure 2:
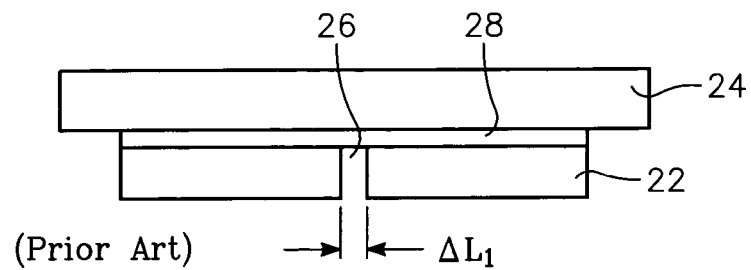
FIG. 2 is a cross-sectional view of a conventional sputter target assembly including multiple target tiles bonded to a backing plate.

The arrangement of two tiles illustrated in FIG. 2 represents the simplest tile arrangement, two tiles in a linear array with a single gap between them. Demaray in the aforecited patent discloses a larger number N>2 of tiles in a linear array with (N−1) gaps between them. Tepman in U.S. patent application Ser. No. 10/888,383, filed Jul. 9, 2004 discloses a two-dimensional array of tiles with vertical and horizontally extending gaps intersecting each other. The array may be a rectangular array, a staggered array as in simple brick wall, or more complicated two-dimensional arrays including herringbone patterns. Although rectangular tiles present the simplest geometry, other tile shapes are possible, such as triangular and hexagonal tile shapes with correspondingly more complex gap arrangements.

Figure 3:
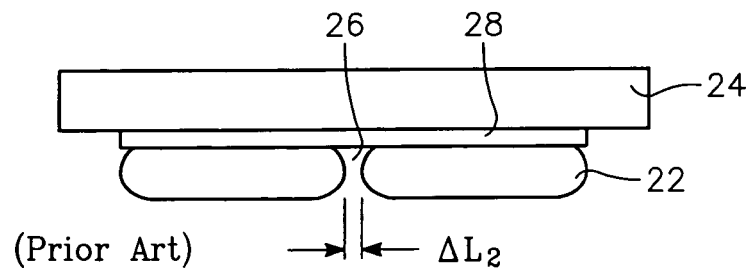
FIG. 3 is a cross-sectional view of a deleterious crowning of tiles with the conventional sputter target assembly of FIG. 2.

The gap 26 between tiles must be carefully designed and maintained. Typically, the gap is not filled with other material and the adhesive 28 or material other than the target material is exposed at the bottom of the gap 26. However, if the gap (or at least part of it) is maintained at about 0.3 mm, then the sputtering plasma cannot propagate into the gap because the gap is less than the plasma dark space. With no plasma propagating to the bottom of the gap, the backing plate or adhesive exposed at the bottom of the gap is not sputtered. However, after burn in of the target at high power and high temperature, the tiles are likely to deform and develop a crown-like shape illustrated in FIG. 3 and the gap is reduced to $\Delta L_2$, which is less than $\Delta L_1$ and may be zero. Uncontrolled gap size may cause arcing during deposition, which is likely to produce large particles creating defects in the display. The crown shape means that the distance between the target tiles and the panel being coated is not uniform, thus introducing non-uniformities in deposition. It is believed that the crown shape represents partial delamination of the target tile from the backing plate results in lack of direct thermal contact between the central portions of the target tiles from the backing plate being used to cool the tiles, further increasing the average temperature and temperature differentials.

The crown shape of the target tiles is believed to arise from the thermal expansion mismatch between the target material, for example, molybdenum, the adhesive, particularly a polymeric adhesive, and the backing plate, for example, titanium. The thermal mismatch produces stress in the adhesive, which is a function of the bonded area and the thickness of the adhesive. According to the well known theory of static deformation, stress S in the adhesive layer is related to the strain $\epsilon$ through the modulus of elasticity G by the relation $$S = G\epsilon.$$

The strain $\epsilon$ is related to the dimensional change $\Delta L$ over a length L and to the differential coefficient of thermal expansion $\Delta\alpha$ and temperature change $\Delta T$ according to $$\varepsilon = \frac{\Delta L}{L} = \Delta T \cdot \Delta \alpha.$$

It is believed that the greatest stress arises between the adhesive and the target tile. The invention allows the reduction of stress for number of reasons. The width of the adhesive layer may be reduced. The thickness t of the adhesive layer may be increased while the width of the bonded area is reduced since the stress also varies with the thickness of the layer over which the strain must be accommodated according to $$\varepsilon \propto \frac{\Delta t}{t}$$

so that increasing the thickness decreases the stress. However, increased thickness t in a planar adhesive layer is not desired because of the increased thermal impedance. The direction of stress may also be controlled.

Figure 4:
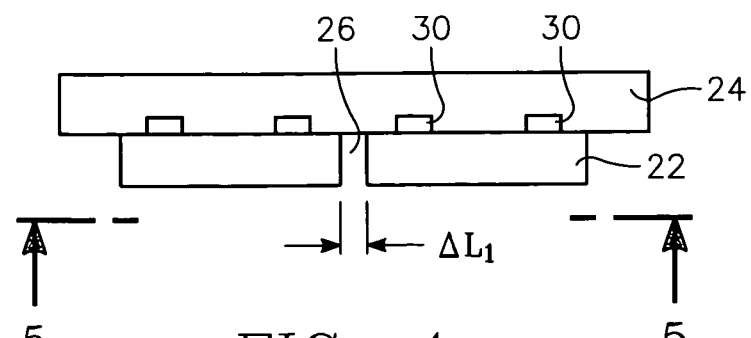
FIG. 4 is a cross-sectional view of an embodiment of a sputter target assembly of the invention including recesses for adhesive bonding the tiles to the backing plate.

In one embodiment of the invention illustrated in the cross-sectional view of FIG. 4, one or more grooves 30 are formed in the backing plate 24 in areas underlying the respective tiles 22. The grooves 30 are filled with adhesive, for example, a conductive polymeric adhesive and the target tiles 22 are bonded to the backing plate 24 through the adhesive in a bonding technique including pressure and typically an elevated temperature. Non-bonded areas may contact the backing plate 24 for effective thermal coupling. The uncertain electrical contact across the two non-bonded members 22, 24 is guaranteed by the conduction paths through the conductive polymeric adhesive.

Although there is great freedom in the parameters of the grooves 30 of this embodiment and others, it has been found advantageous to form the grooves with depth of between 0.1 to 0.5mm and the total area of the grooves is between about 30 and 45% of the total area of the respective tile they is bonding to the backing plate 24.

Figure 5:
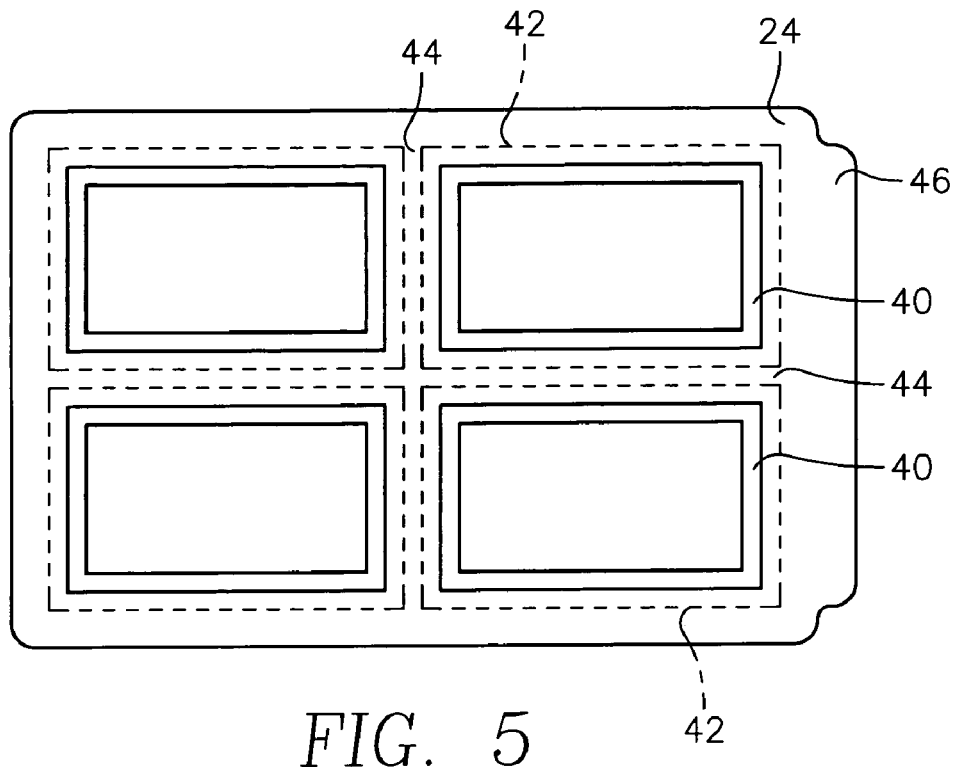
FIG. 5 is a bottom plan view taken along view line 5-5 of FIG. 4 of a first embodiment of an arrangement of a peripheral adhesive recess.

The grooves may be arranged in a number of different ways. In a first embodiment illustrated in the plan view of FIG. 5, a peripheral groove 40 is associated with each tile, represented by dotted lines 42. The groove 40 is formed in the backing plate 24 as a closed rectangular band generally at the periphery or inside the periphery of the tile 42. The grooves 40 are filled with adhesive and the tiles 42 are placed over the backing plate 24 in the indicated positions and bonded to the backing plate 24 with predetermined gaps 44 between them. It is possible to vary the width and depth of each of the grooves, for example, between perpendicular sides of a non-square target tile, to control the stress in the tile. The large area of the backing plate 24 outside the outline of the tiles 42 forms part of the vacuum-sealed chamber wall, and the backing plate 24 includes one or more extensions outside the outline of the chamber wall to accommodate an electrical connection and plumbing ports for the cooling water circulating in the backing plate 24 to cool it and the tiles 42 during sputtering.

Note that the number of tiles 42 is not limited to the illustrated 2×2 array. The tiles 42 can form a simple linear array or can be arranged in a larger two-dimensional array. The individual tiles can have a more even aspect ratio, that is, more square, or a larger aspect ratio. The invention can be applied to less regularly shaped and arranged tiles with gaps between them. Indeed, some aspects of the invention are applicable to a single tile more common with smaller sized targets.

Figure 6:
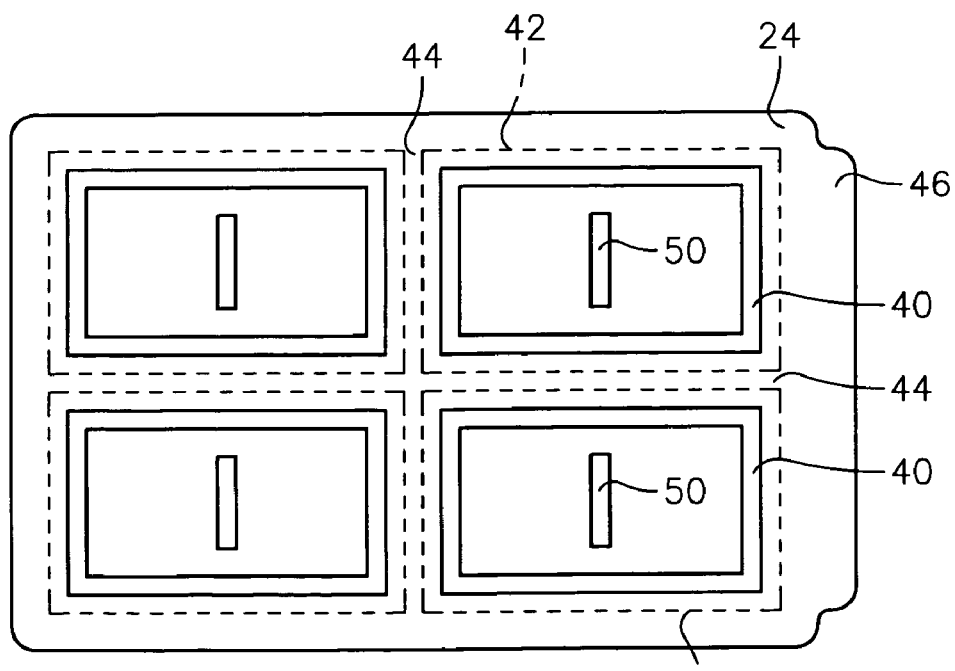
FIG. 6 is a bottom plan view of a second embodiment of an arrangement of a peripheral adhesive recess and one interior adhesive recess.
Figure 7:
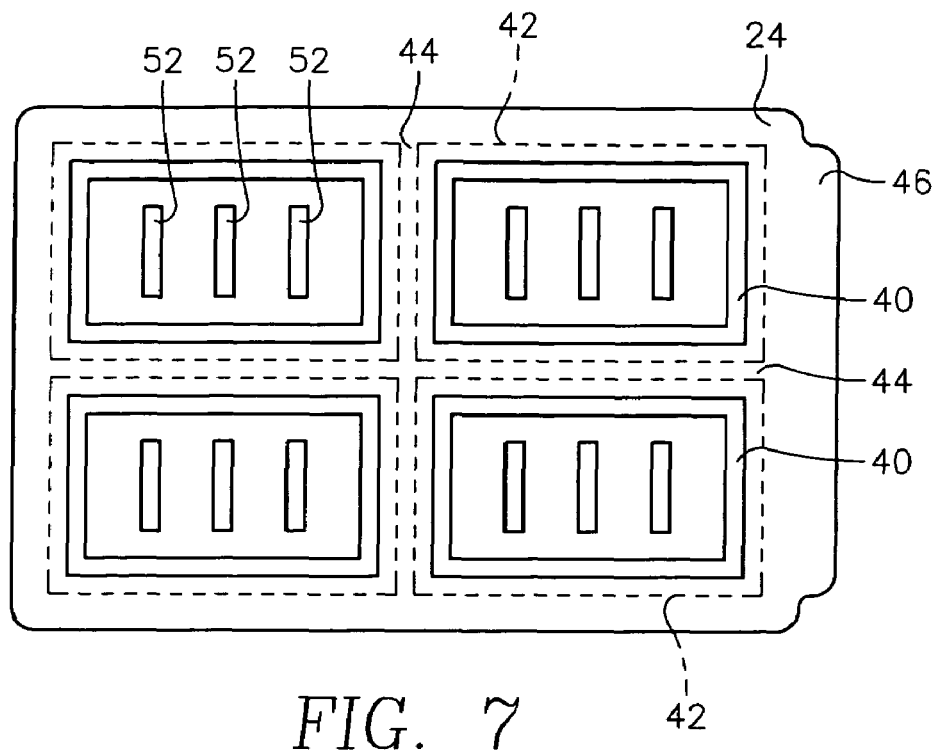
FIG. 7 is a bottom plan view of a third embodiment of an arrangement of a peripheral adhesive recess and multiple parallel interior adhesive recesses.

In another embodiment illustrated in the plan view of FIG. 6, a central groove 50 is formed inside the peripheral groove 40 parallel to one of the linear portions of the peripheral groove 40. Generally, the central groove 50 may be connected or not connected to the peripheral groove 40. The widths and depths of the grooves 40, 50 maybe the same or maybe different, thereby allowing further control of the stress within the tile 42. This embodiment can be extended to multiple parallel central grooves 52, illustrated in the plan view of FIG. 7. The multiple parallel grooves 52, are separated from each other and from the peripheral groove 40. They may have the same or different widths and depths compared to the peripheral groove, and they may have the same or different widths, depths, and lengths among themselves. Three central grooves 52 are illustrated in FIG. 7, but the number is not so limited.

Figure 8:
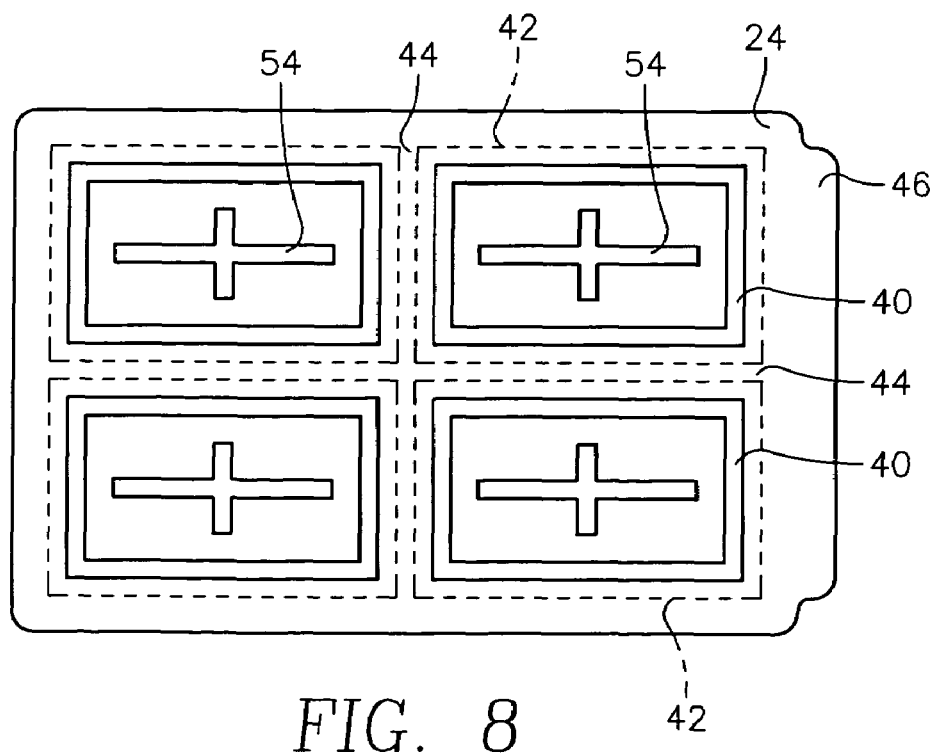
FIG. 8 is a bottom plan view of a fourth embodiment of an arrangement of a peripheral adhesive recess and two Cartesian crossing interior adhesive recesses.
Figure 9:
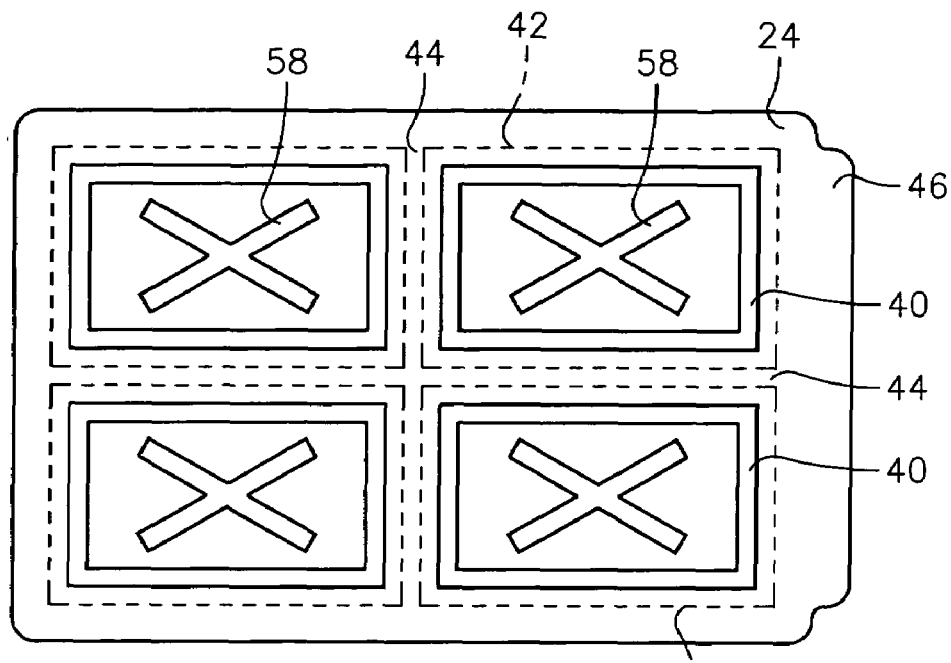
FIG. 9 is a bottom plan view of a fifth embodiment of an arrangement of a peripheral adhesive recess and two obliquely arrangement crossing interior adhesive recesses.

In yet a further embodiment illustrated in the bottom plan view of FIG. 8, the peripheral groove 40 surrounds an internal cross-shaped groove 54 with linear portions extending in Cartesian coordinates parallel to the edges of the tile 42 and preferably crossing at the center of the tile 42. The cross-shaped groove 54 may have the same depth and width as the peripheral groove 40 or the depths and widths may be different. The perpendicular arms of the cross-shaped groove 54 may have the same or different depths, widths, and lengths between them. In a variant illustrated in the bottom plan view of FIG. 9, an X-shaped groove 58 has arms extending generally along diagonals of the tile 42 and crossing at the center of the tile 42.

Figure 10:
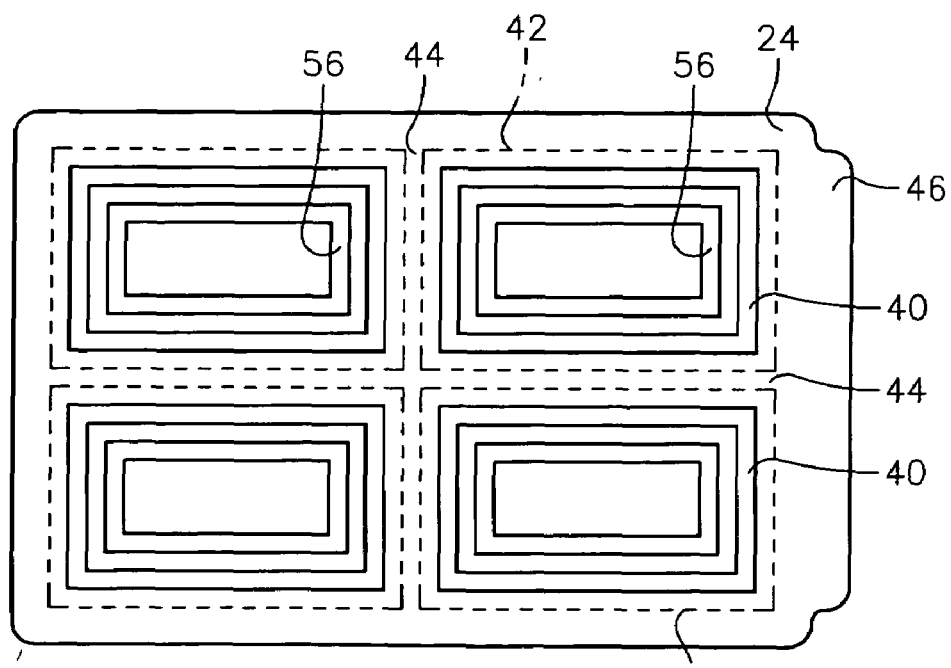
FIG. 10 is a bottom plan view of a sixth embodiment of an arrangement of a peripheral adhesive recess and a closed interior adhesive recess.

More complex combinations are possible. For example, as illustrated in the bottom plan view of FIG. 10, the peripheral groove 40 surrounds a closed internal groove 56 of similar but smaller rectangularlized annular shape. The depths of the two concentric grooves 40, 56 may differ in order to control the stress over the distance from the centers of the tiles 42.

The adhesive or bonding method is not limited to a polymeric or organic adhesive. Other adhesives such as indium may be used.

Although the embodiments described above have been applied to multi-tile targets, recesses in the backing plate filled with adhesive may be used with single-tile rectangular targets and with circular targets whether composed of one or more tiles.

Although the above embodiments includes a closed peripheral recess, the invention is not limited to such. For example, the target of FIG. 7 may include the multiple parallel recesses 52 for each tile 42 but no peripheral recess 40.

The invention thus provides a simple method of controlling and reducing stress in the bonding of one or more sputtering target tiles to a backing plate and thus enhancing sputtering performance.

The invention claimed is:

1. A sputtering target assembly, comprising:
a backing plate; and
at least one target tile bonded to said backing plate in a respective tile area thereof and configured for sputtering from the target tile of a material of the target tile;
wherein said backing plate is formed with at least one predetermined recess filled with said adhesive.

2. The assembly of claim 1, wherein said at least one target tile comprises a plurality of target tiles with one or more gaps therebetween.

3. The assembly of claim 1, wherein said at least one recess includes an annular recess respectively formed in said respective tile area.

4. The assembly of claim 3, wherein each of said annular recesses comprises two parallel straight first recesses and two parallel straight recesses connected to said first recesses and extending perpendicularly thereto.

5. The assembly of claim 3, wherein said at least one recess includes one or more additional recesses formed inside of and separate from said annular recess.

6. The assembly of claim 5, wherein said one or more additional recesses are substantially symmetrically formed about perpendicular bisectors of said respective tile area.

7. The assembly of claim 5, wherein said one or more additional recesses include one or more straight recesses extending along a first direction.

8. The assembly of claim 5, wherein said one or more additional recesses include a cross-shaped recess.

9. The assembly of claim 8, wherein a cross section of said cross-shaped recess differs from a cross-section of said annular recess in at least one of depth and width.

10. The assembly of claim 8, wherein said cross-shaped recess extends along perpendicular bisectors of said respective tile area.

11. The assembly of claim 8, wherein said cross-shaped recess extends along diagonals of said respective tile area.

12. The assembly of claim 1, wherein said at least one recess has a depth in a range of 0.1 to 0.5 mm.

13. The assembly of claim 1, wherein said at least one recess has an area of between 30 and 45% of said respective tile area.

14. A sputtering target assembly, comprising:
a backing plate; and
at least one target tile bonded to said backing plate in a respective tile area thereof and configured for sputtering from the target tile of a material of the target tile;
wherein said backing plate is formed with at least one predetermined recess filled with said adhesive and wherein said at least one recess includes a first recess and a second recess differing between the in at least one of depth and width.

15. The assembly of claim 1, wherein said at least one tile is substantially rectangularly shaped.

16. The assembly of claim 1, wherein said adhesive comprises a polymer.

17. A sputtering target assembly, comprising:
a backing plate configured for attachment to a vacuum chamber,
at least one target tile bonded to said backing plate in a respective tile area thereof and configured for sputtering from the target tile of a material of the target tile, wherein the at least one target tile comprises a material to be sputtered in the vacuum chamber,
wherein said backing plate is formed with at least one predetermined recess filled with said adhesive;
wherein the at least one predetermined recess has a recess area smaller than the respective tile area of the respective tile bonded in the respective tile area, and
wherein the at least one predetermined recess extends only partially through the backing plate in each of said tile areas.

18. The assembly of claim 1, wherein the at least one target tile includes
a plurality of target tiles, a respective predetermined gap being formed between neighboring ones of the target tiles bonded to the backing plate.

* * * * *